United States Patent
Luo et al.

(10) Patent No.: US 9,679,924 B2
(45) Date of Patent: Jun. 13, 2017

(54) ARRAY SUBSTRATE AND MANUFACTURING METHOD THEREOF, DISPLAY DEVICE

(71) Applicants: BOE Technology Group Co., Ltd., Beijing (CN); Hefei BOE Optoelectronics Technology Co., Ltd., Anhui (CN)

(72) Inventors: Qiangqiang Luo, Beijing (CN); Xiaoyu Yang, Beijing (CN); Kiyoung Kwon, Beijing (CN); Zhenfang Li, Beijing (CN); Xiaojun Su, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/098,466

(22) Filed: Apr. 14, 2016

(65) Prior Publication Data
US 2017/0012058 A1 Jan. 12, 2017

(30) Foreign Application Priority Data
Jul. 6, 2015 (CN) .......................... 2015 1 0395718

(51) Int. Cl.
H01L 29/15 (2006.01)
H01L 27/12 (2006.01)

(52) U.S. Cl.
CPC ........ *H01L 27/124* (2013.01); *H01L 27/1262* (2013.01)

(58) Field of Classification Search
CPC ..................... H01L 27/124; H01L 27/1262
USPC .................................................... 257/72, 59
See application file for complete search history.

(56) References Cited

U.S. PATENT DOCUMENTS

2009/0152730 A1* 6/2009 Chen .................. H01L 27/124
257/773

* cited by examiner

*Primary Examiner* — Tu-Tu Ho
(74) *Attorney, Agent, or Firm* — Banner & Witcoff, Ltd.

(57) ABSTRACT

An array substrate and manufacturing method thereof, a display device are provided. The array substrate includes a display region and a non-display region; the non-display region includes a first laminated structure and a second laminated structure that are separately disposed on a base substrate, a gap between the first laminated structure and the second laminated structure constitutes a connecting hole; the first laminated structure includes a first via hole provided for exposing a first metal layer, the second laminated structure includes a second via hole provided for exposing a second metal layer, the first via hole and the second via hole are connected to a connecting hole via breaches on corresponding walls, and the first metal layer and the second metal are electrically connected with a conductive film.

18 Claims, 3 Drawing Sheets

ARRAY SUBSTRATE AND MANUFACTURING METHOD THEREOF, DISPLAY DEVICE

This application claims priority to and the benefit of Chinese Patent Application No. 201510395718.X filed on Jul. 6, 2015, which application is incorporated herein in its entirety.

TECHNICAL FIELD

Embodiments of the present invention relate to an array substrate and a manufacturing method thereof, a display device.

BACKGROUND

At present, an array substrate is generally obtained by manufacturing a thin film transistor array pattern on a base substrate. The fabrication process of this array substrate is relatively complex, and for the sake of reducing the cost, in the actual fabricating process of the array substrate, people generally will make use of a gate layer in the array substrate to load two signals (e.g. a Com signal and a Gate signal) simultaneously, and in order to avoid lead wires of the two signals from coinciding with each other, it is necessary to establish a gate via hole for addition of a jumper film layer on a gate insulating layer. Meanwhile, for the sake of connecting a drain electrode to a pixel electrode so as to achieve charging of the pixel electrode with the use of the drain electrode, a drain via hole will also be provided on a passivation layer, so that the pixel electrode is connected to the drain electrode through the drain via hole. During fabrication of the array substrate, the gate via hole and the drain via hole is accomplished by etching process through one patterning process.

However, as thickness of the passivation layer and thickness of the gate insulating layer are different, after an insulating material for the passivation layer in the drain via hole is wholly etched away, there still remains a gate insulating layer material in the gate via hole. In order to ensure that insulating materials within the gate via hole and the drain via hole are completely etched, this problem is generally solved by way of overetch upon etch; but this will make an insulating material on the contact interface between the drain electrode and the passivation layer be over-etched, and each of the jumper film layer in the gate via hole and lead wires in the drain via hole is an ITO film, which has relatively poor fault-tolerance ability with respect to over-etch. When an insulating material on the contact interface between the drain electrode and the passivation layer is over-etched, it is very prone to be broken, and this leads to incapability of normal transmission of signals.

SUMMARY

One embodiment of the present disclosure provides an array substrate, comprising a display region and a non-display region; the non-display region including a first laminated structure and a second laminated structure that are separately disposed on a base substrate, with a gap therebetween for forming a connecting hole; the first laminated structure including a first metal layer, a first insulating layer and a first passivation layer sequentially disposed in a laminated manner on the base substrate; the second laminated structure including a second insulating layer, a second metal layer and a second passivation layer sequentially disposed in a laminated manner on the base substrate; wherein, the first passivation layer and the first insulating layer are provided with a first via hole running through the first passivation layer and the first insulating layer therein, a wall of the first via hole is provided a first breach in a height direction of the first via hole, a length of the first breach is the same as a height of the first via hole; the second passivation layer is provided with a second via hole running through it, a wall of the second via hole is provided with a second breach in a height direction of the second via hole, a length of the second breach is the same as a height of the second via hole; the first via hole is communicated with the connecting hole via the first breach, the second via hole is communicated with the connecting hole via the second breach, the first via hole, the second via hole and the connecting hole are formed to be a non-display region via hole; the first metal layer and the second metal layer are electrically connected with a conductive film provided within the first via hole, the connecting hole and the second via hole.

Another embodiment of the present disclosure provides a display device including the array substrate as mentioned above.

Another embodiment of the present disclosure provides a manufacturing method of the array substrate claimed as claim 1, comprising: step S1: forming a first laminated structure and a second laminated structure on a base substrate; wherein, the first laminated structure includes a first metal layer, a first insulating layer and a first passivation layer sequentially disposed in a laminated manner on the base substrate; the second laminated structure includes a second insulating layer, a second metal layer and a second passivation layer sequentially disposed in a laminated manner on the base substrate; the first insulating layer and the second insulating layer are joined, and the first passivation layer and the second passivation layer are joined to form a passivation layer; step S2: forming a gap between the first laminated structure and the second laminated structure, so that that gap between the first laminated structure and the second laminated structure constitutes a connecting hole, the first insulating layer and the second insulating layer that are joined are separate, and the first passivation layer and the second passivation layer that are joined are separate; providing a first via hole that runs through the first passivation layer and the first insulating layer in the first passivation layer, providing a second via hole that runs through the second passivation layer in the second passivation layer; wherein, a wall of the first via hole is provided with a first breach in a height direction of the first via hole, a length of the first breach is the same as a height of the first via hole; a wall of the second via hole is provided with a second breach in a height direction of the second via hole, a length of the second breach is the same as a height of the second via hole; the first via hole is communicated with the connecting hole via the first breach, the second via hole is communicated with the connecting hole via the second breach, and the first via hole, the second via hole and the connecting hole are formed to be a non-display region via hole; and Step S3: forming a conductive film within the first via hole, the connecting hole and the second via hole, so that the first metal layer and the second metal layer are connected with the conductive film.

Still another embodiment of the present disclosure provides a manufacturing method of an array substrate, comprising: forming a first metal layer pattern on the base substrate, forming an insulating layer on the base substrate and the first metal layer pattern, forming a second metal layer pattern on the insulating layer, the first metal layer pattern and the second metal layer pattern being staggered with respect to each other in a direction parallel to a surface of the base substrate so as to form an interval between them, forming a passivation layer on the insulating layer and the second metal layer pattern, forming a connecting hole at a location of the passivation layer and the insulating layer corresponding to the interval between the first metal layer pattern and the second metal layer pattern, so that the insulating layer is formed to be a first insulating layer over the first metal layer pattern and a second insulating layer below the second metal layer pattern, and the passivation layer is formed to be a first passivation layer over the first metal layer pattern and a second passivation layer over the second metal layer pattern, forming a first via hole in the first passivation layer and the first insulating layer, so as to expose partial surface of the first metal layer pattern; forming a second via hole in the second passivation layer, so as to expose partial surface of the second metal layer pattern, the first via hole and the second via hole being each communicated with the connecting hole, and forming a conductive film within the first via hole, the connecting hole and the second via hole, so that the first metal layer and the second metal layer are connected with the conductive film.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Figure 1:
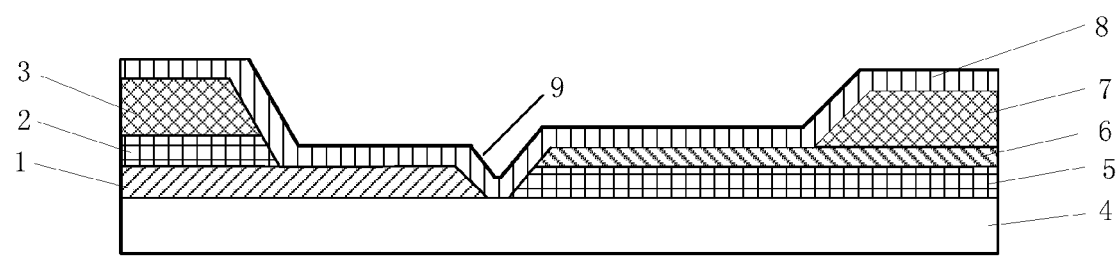
FIG. 1 is a structurally schematic view illustrating a non-display region in an array substrate provided by an embodiment of the invention.

Please refer to FIG. 1, an array substrate provided by an embodiment of the invention includes a display region and a non-display region; the non-display region includes a first laminated structure and a second laminated structure disposed separately on a base substrate 4; a gap between the first laminated structure and the second laminated structure constitutes a connecting hole 90. The first laminated structure includes a first metal layer 1, a first gate insulating layer 2 and a first passivation layer 3 that are sequentially disposed in a laminated manner on the base substrate 4; and the second laminated structure includes a second gate insulating layer 5, a second metal layer 6 and a second passivation layer 7 that are sequentially disposed in a laminated manner on the base substrate 4. The first metal layer 1 is disposed on the base substrate 4, and the second gate insulating layer 5 is disposed on the base substrate 4.

Figure 2:
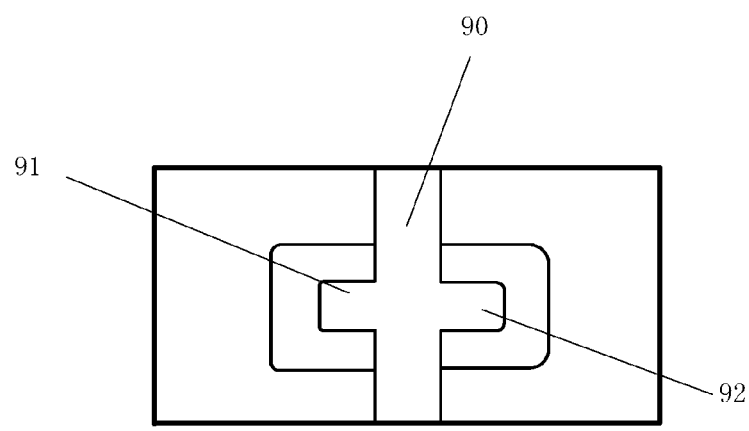
FIG. 2 is a schematically top view illustrating the structure illustrated in FIG. 1.

Please refer to FIG. 2, a first via hole 91 running through the first passivation layer 3 and the first gate insulating layer 2 is provided in the first passivation layer 3 and the first gate insulating layer 2, a first breach in the height direction of the first via hole 91 is provided on the wall of the first via hole 91, and a length of the first breach is the same as a height of the first via hole 91; a second via hole 92 running through the second passivation layer 7 is provided in the second passivation layer 7, a second breach in the height direction of the second via hole 92 is provided on the wall of the second via hole 92, and a length of the second breach is the same as a height of the second via hole 92. The first via hole 91 is communicated with the connecting hole 90 by the first breach, and the second via hole 92 is communicated with the connecting hole 90 through the second breach. The first via hole 91, the second via hole 92 and the connecting hole 90 form a non-display region via hole 9, and the first metal layer 1 and the second metal layer 6 are electrically connected with a conductive film 8 provided within the first via hole 91, the connecting hole 90 and the second via hole 92.

For example, partial surface of the first metal layer 1 is exposed by the first via hole 91, and partial surface of the second metal layer 6 is exposed by the second via hole 92.

When a signal needs to be loaded to an electrode, the first metal layer 1 and the second metal layer 6 are connected to the electrode in need of signal loading through wires simultaneously, and the conductive film 8 is connected to a voltage source for providing the signal. By doing this, the signal provided by the voltage source can be transmitted to the electrode in need of signal loading through the conductive film 8 and the first metal layer 1 and the second metal layer 6 that are connected to the conductive film 8.

As can be seen from the signal transmission procedure of a non-display region of the above array substrate, in the non-display region of the array substrate provided by the embodiment, a first via hole 90 is provided on a first passivation layer 3 in a first laminated structure, a second via hole 92 is provided on a second passivation layer 7 in a second laminated structure, on the wall of the first via hole 91, there is also provided a first breach in the height direction of the first via hole 91, the length of which is the same as the height of the first via hole 91; and on the wall of the second via hole 92, there is provided a second breach in the height direction of the second via hole 92, the length of which is the same as the height of the second via hole 92. Consequently, the first via hole 91 and the second via hole 92 are substantially semi-enclosed via holes, and a gap between the first laminated structure and the second laminated structure constitutes a connecting hole 90. Moreover, the first via hole 91 is communicated with the connecting hole 90 through the first breach, and the second via hole 92 is communicated with the connecting hole 90 through the second breach. As such, the connecting hole 90, and the first via hole 91 and the second via hole 92 that are substantially semi-enclosed holes are connected to be an enclosed, non-display region via hole 9. And due to the fact that the first via hole 91 runs through the first passivation layer 3 and the first gate insulating layer 2, so that the first metal layer 1 is exposed from the bottom of the first via hole 91, and the second via hole 92 runs through the second passivation layer 7 so that the second metal layer 6 is exposed from the bottom of the second via hole 92, when the first via hole 91, the second via hole 92 and the connecting hole 90 are communicated with each other to form an enclosed, non-display region via hole 9, the first metal layer 1 and the second metal layer 6 can be conductive as long as a conductive film 8 is placed in the first via hole 91, the second via hole 92 and the connecting hole 90. Even if an overetch phenomenon happens to an insulating material on the contact interface between the second metal layer 6 and the second passivation layer 7, resulting in rupture of the conductive film 8 located in the second via hole 92, it is also possible for the second metal layer 6 at the bottom of the second via hole 92 to transmit signals normally with the conductive film 8 disposed in the connecting hole 90 and the first via hole 91.

For example, the above-mentioned unenclosed first via hole and second via hole means that cross sections of the first via hole and the second via hole taken in a direction parallel to a surface of the base substrate are unenclosed patterns. For example, openings of the unenclosed patterns are connected to a connecting hole, and so, the first via hole and the second via hole are communicated with the connecting hole.

For example, the first gate insulating layer 2 and the second gate insulating layer 5 are formed at the same time as a gate insulating layer of a thin film transistor in a display region, and are formed of the same material as it. For example, the first gate insulating layer 2 and the second gate insulating layer 5 are each connected to the gate insulating layer of the thin film transistor.

Moreover, various signals (e.g. a gate signal, a common terminal signal or a source/drain signal) may be loaded in common to the first metal layer 1 and the second metal layer 6; when a gate signal is loaded, the first metal layer 1 and the second metal layer 6 are connected to a gate electrode with the conductive film 8, when a common terminal signal is loaded, the first metal layer 1 and the second metal layer 6 are connected to a common electrode with the conductive film 8, and when a source/drain signal is loaded, the first metal layer 1 and the second metal layer 6 are connected to a source/drain electrode with the conductive film 8.

Furthermore, for the sake of signal transmission, material of the above conductive film 8 may be any conductive material, such as a common metal material, ITO (Indium Tin Oxide) material. For example, a material of the above conductive film 8 is the same as a material of a pixel electrode. As such, upon manufacture of the pixel electrode, the conductive film 8 can be manufactured together, and there is no need to manufacture a conductive film 8 anew. Thus, complexity of the process is reduced. In addition, when the first metal layer 1 and the second metal layer 6 are connected to a source/drain electrode with the conductive film 8, there is no need to specially produce a via hole for connecting the pixel electrode and the source/drain electrode in a display region of the array substrate. Thus, the number of via holes on the array substrate is decreased, and this brings about enhancement in an actual utilization rate of the array substrate.

It is to be noted that, in a non-display region of the array substrate provided by the above embodiment, an active layer that is removed originally may be reserved, and the reserved active layer includes a first active layer disposed between a first gate insulating layer 2 and a first passivation layer 3 and a second active layer disposed between a second gate insulating layer 5 and a second metal layer 6.

Figure 3:
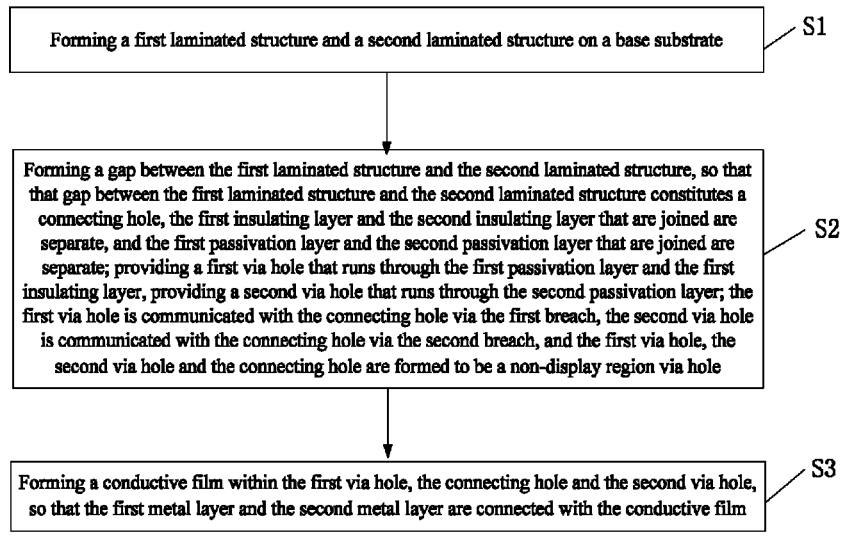
FIG. 3 is a flowchart illustrating manufacture of a non-display region in a manufacturing method of an array substrate provided by an embodiment of the invention.
Figure 4:
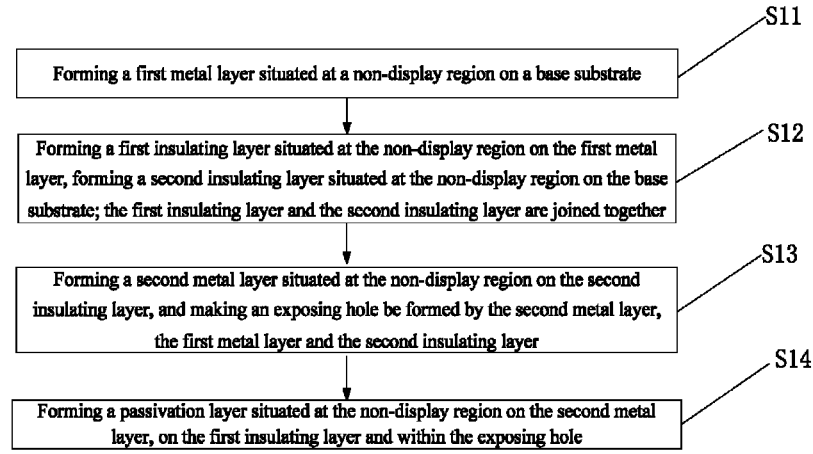
FIG. 4 is a concrete flowchart illustrating a step S1 in FIG. 3.
Figure 5:
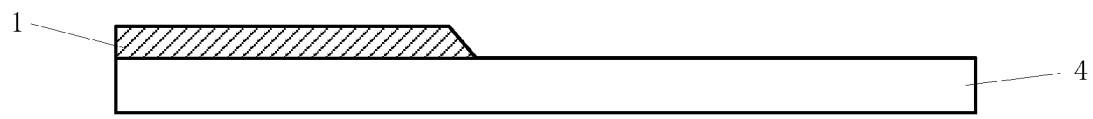
FIG. 5 is a schematic view illustrating the structure obtained by step S11 in FIG. 4.
Figure 6:
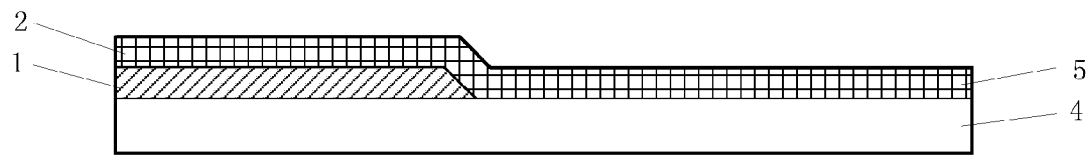
FIG. 6 is a schematic view illustrating the structure obtained by step S12 in FIG. 4.
Figure 7:
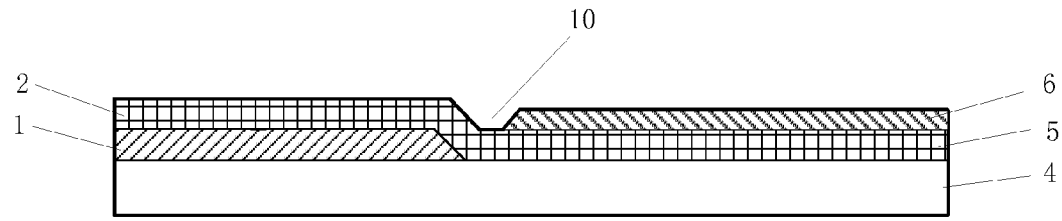
FIG. 7 is a schematic view illustrating the structure obtained by step S13 in FIG. 4.

Please refer to FIGS. 1 to 3, a manufacturing method of the array substrate in the above technical solution of the present invention includes the following steps:

Step S1: a first laminated structure and a second laminated structure are formed on a base substrate 4; wherein, the first laminated structure includes a first metal layer 1, a first gate insulating layer 2 and a first passivation layer 3 sequentially disposed in a laminated manner on the base substrate 4; the second laminated structure includes a second gate insulating layer 5, a second metal layer 6 and a second passivation layer 7 sequentially disposed in a laminated manner on the base substrate 4; the first gate insulating layer 2 and the second gate insulating layer 5 are joined, and the first passivation layer 3 and the second passivation layer 7 are joined to form a passivation layer;

Step S2: a gap is formed between the first laminated structure and the second laminated structure, so that the gap between the first laminated structure and the second laminated structure constitutes a connecting hole 90, the joined first gate insulating layer 2 and the second insulating layer 5 become separate, and the joined first passivation layer 3 and the second passivation layer 7 become separate; a first via hole 91 running through the first passivation layer 3 and the first gate insulating layer 2 is provided in the first passivation layer 3, and a second via hole 92 running through the second passivation layer 7 is provided in the second passivation layer 7; wherein, a first breach in the height direction of the first via hole 91 is provided on the wall of the first via hole 91, and a length of the first breach is the same as a height of the first via hole 91; a second breach in the height direction of the second via hole 92 is provided on the wall of the second via hole 92, and a length of the second breach is the same as a height of the second via hole 92; the first via hole 91 is communicated with the connecting hole 90 by the first breach, the second via hole 92 is communicated with the connecting hole 90 through the second breach, and the first via hole 91, the second via hole 92 and the connecting hole 90 form a non-display region via hole 9;

Step S3: a conductive film 8 is formed within the first via hole 91, the connecting hole 90 and the second via hole 92, so that the first metal layer 1 and the second metal layer 6 are connected with the conductive film 8.

The manufacturing method of the array substrate provided by the embodiment has the same beneficial effects as the above-mentioned array substrate, and details are omitted here.

Please refer to FIGS. 4 to 7, an exemplified process of the above step S1 includes the following steps:

Step S11: a first metal layer 1 situated at a non-display region is formed on a base substrate 4;

Step S12: a first gate insulating layer 2 situated at the non-display region is formed on the first metal layer 1, a second gate insulating layer 5 situated at the non-display region is formed on the base substrate 4; the first gate insulating layer 2 and the second gate insulating layer 5 are joined together;

Step S13: a second metal layer 6 situated at the non-display region is formed on the second gate insulating layer 5, and an exposing hole 10 is formed by the second metal layer 6, the first gate insulating layer 2 and the second gate insulating layer 5;

Step S14, a passivation layer situated at the non-display region is formed on the second metal layer 6, on the first gate insulating layer 2 and within the exposing hole 10.

Figure 8:
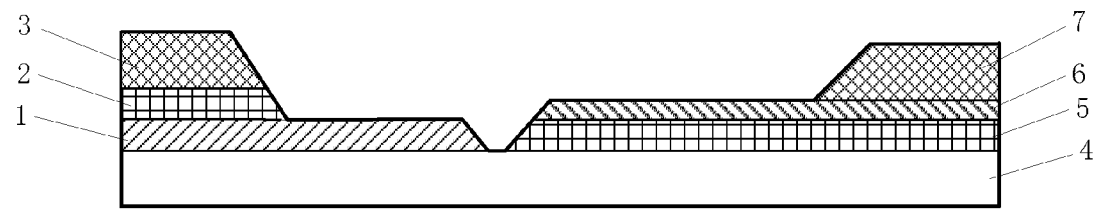
FIG. 8 is a schematic view illustrating the structure obtained by step S2 in FIG. 3.

Please refer to FIG. 2 and FIG. 8, an exemplified process of the above step S2 includes the following steps: a first via hole 91 is provided within a region of the passivation layer corresponding to the first gate insulating layer 2, so that the first via hole 91 runs through the first gate insulating layer 2 and a region of the passivation layer corresponding to the first gate insulating layer 2; a second via hole 92 is provided within a region of the passivation layer corresponding to the second metal layer 6, so that the second via hole 92 runs through a region of the passivation layer corresponding to the second metal layer 6; a connecting hole 90 is provided within a region of the passivation layer corresponding to the exposing hole 10, so that the connecting hole 90 runs through the second gate insulating layer 5 and a region of the passivation layer corresponding to the exposing hole 10. The connecting hole 90 is communicated with the first via hole 91 and the second via hole 92, respectively, so that the joined first gate insulating layer 2 and the second gate insulating layer 5 become separate, and moreover, a first passivation layer 3 is obtained on the first gate insulating layer 2, and a second passivation layer 7 is obtained on the second metal layer 6.

In the manufacturing method of the array substrate provided as above, in such a manner that a second metal layer 6 situated at a non-display region is formed on a second gate insulating layer 5, and an exposed hole 10 is formed by the second metal layer 6, the first gate insulating layer 2 and the second gate insulating layer 5, while a passivation layer in the non-display region has a portion that is formed in the exposing hole, the same establishing method as that for the first via hole 91 and the second via hole 92 can be used for establishing a connecting hole 90 when the connecting hole 90 is provided within a region of the passivation layer corresponding to the exposing hole 10. Consequently, establishment of the first via hole 91, the second via hole 92 and the connecting hole 90 is accomplished at one time. Moreover, due to the fact that an exposing hole 10 is formed by the second metal layer 6, the first gate insulating layer 2 and the second gate insulating layer 5, above the second gate insulating layer 5 penetrated by the connecting hole 90, there is no shelter of the second metal layer 6. Consequently, establishment of the first via hole 91, the second via hole 92 and the connecting hole 90 is accomplished at one time.

It is to be noted that, only the manufacturing method of a non-display region of an array substrate is disclosed by the above embodiment, but because structure of a display region of the array substrate has the same method used in conventional manufacturing methods, even if the manufacture method of the display region of the array substrate is not disclosed, the array substrate can also be manufactured by adopting the above manufacturing method.

Furthermore, generally speaking, a first metal layer 1 at a non-display region is produced together with a gate electrode at a display region, a first gate insulating layer 2 and a second gate insulating layer 5 that are joined together at the non-display region are produced together with a gate insulating layer at the display region; a second metal layer 6 at the non-display region is produced together with source and drain electrodes at the display region, and a conductive film 8 at the non-display region may be produced together with a pixel electrode at the display region.

For example, when a material of a conductive film 8 is the same as a material of a pixel electrode, the conductive film 8 and the pixel electrode are formed by one patterning process; moreover, when a first metal layer 1 and a second metal layer 6 are each connected to a source/drain electrode, the process of forming a conductive film 8 in a first via hole 91, a connecting hole 90 and a second via hole 92 at a non-display region is that, a pixel material layer is formed on a first passivation layer 3 and a second passivation layer 7 and in the first via hole 91, the second via hole 92 and the connecting hole 90 at the non-display region, and next, the conductive film 8 in the first via hole 91, the second via hole 92 and the connecting hole 90 is formed by one patterning process. As the first metal layer 1 and the second metal layer 6 are each connected to a source/drain electrode, and the first metal layer 1 and the second metal layer 6 in the non-display region is connected to a power supply for providing signals with the conductive film 8, connection between the pixel electrode and the source/drain electrode is achieved. Thus, establishment of a via hole for connecting the pixel electrode and the source/drain electrode within a display region is avoided.

In addition, for the sake of facilitating the operation, when the first via hole 91, the second via hole 92 and the connecting hole 90 are formed by one patterning process, the first metal layer 1 and a gate electrode have the same material, and they are formed by one patterning process; the second metal layer 6 and source and drain electrodes have the same material, and source/drain electrodes, the second metal layer 6 and an exposing hole 10 are formed by one patterning process. Due to the same material, upon one patterning, a patterning process with the identical conditions can be used. Thus, the problem of waste of time caused by changing conditions of the patterning process is avoided.

When an active layer is still reserved in a non-display region, forming method of the active layer is that, a first active layer is formed on a first gate insulating layer 2, a second active layer joined to the first active layer is formed on a second gate insulating layer 5, a second metal layer 6 is formed to be located on the second active layer, a region of a passivation layer corresponding to the first gate insulating layer 2 is formed to be located on the first active layer, and an exposing hole 10 is formed by the first active layer, the second active layer, the first gate insulating layer, the second gate insulating layer 5 and the second metal layer; when a connecting hole is communicated with a first via hole 91 and a second via hole 92, respectively, the joined first active layer and the second active layer become separate.

It is to be noted that, the above one patterning process is generally achieved by mask plus lithography process, but it does not exclude other feasible process.

For example, as can be seen by FIGS. 5 to 8, the manufacturing method of the array substrate according to embodiments of the invention may include the following steps: a first metal layer pattern is formed on the base substrate; an insulating layer is formed on the base substrate and the first metal layer pattern; a second metal layer pattern is formed on the insulating layer, and the first metal layer pattern and the second metal layer pattern are staggered with respect to each other in a direction parallel to a surface of the base substrate so as to form an interval between them; a passivation layer is formed on the insulating layer and the second metal layer patter; a connecting hole is formed at a location of the passivation layer and the insulating layer corresponding to the interval between the first metal layer pattern and the second metal layer pattern, so that the insulating layer is formed to be a first insulating layer above the first metal layer pattern and a second insulating layer above the second metal layer pattern, and the passivation layer is formed to be a first passivation layer over the first metal layer pattern and a second passivation layer over the second metal layer pattern; a first via hole is formed in the first passivation layer and the first insulating layer, so as to expose partial surface of the first metal layer pattern; a second via hole is formed in the second passivation layer, so as to expose partial surface of the second metal layer pattern, the first via hole and the second via hole are each communicated with the connecting hole; a conductive film is formed within the first via hole, the connecting hole and the second via hole, so that the first metal layer and the second metal layer are connected with the conductive film.

A display device provided by embodiments of the invention includes the array substrate in the above technical solution.

The beneficial effects of the display device provided by the embodiment are the same as those of the above array substrate, and details are omitted here.

The display device provided by the above embodiment may be a cell phone, a tablet computer, a television, a display, a notebook computer, a digital photo frame, a navigator or any other product or component having a display function.

In the description of the above embodiments, the concrete characteristics, structures, materials or features may be combined in a suitable manner in any one or more embodiments or examples.

Descriptions made above are merely exemplary embodiments of the present invention, but are not used to limit the protection scope of the invention. The protection scope of the invention is determined by attached claims.

This application claims the benefit of priority from Chinese patent application No. 201510395718.X, filed on Jul. 6, 2015, and the disclosure of which is incorporated herein in its entirety by reference as a part of the present application.

The invention claimed is:

1. An array substrate, comprising a display region and a non-display region; the non-display region including a first laminated structure and a second laminated structure that are separately disposed on a base substrate, with a gap therebetween for forming a connecting hole; the first laminated structure including a first metal layer, a first insulating layer and a first passivation layer sequentially disposed in a laminated manner on the base substrate; the second laminated structure including a second insulating layer, a second metal layer and a second passivation layer sequentially disposed in a laminated manner on the base substrate; wherein, the first passivation layer and the first insulating layer are provided with a first via hole running through the first passivation layer and the first insulating layer therein, a wall of the first via hole is provided a first breach in a height direction of the first via hole, a length of the first breach is the same as a height of the first via hole; the second passivation layer is provided with a second via hole running through it, a wall of the second via hole is provided with a second breach in a height direction of the second via hole, a length of the second breach is the same as a height of the second via hole; the first via hole is communicated with the connecting hole via the first breach, the second via hole is communicated with the connecting hole via the second breach, the first via hole, the second via hole and the connecting hole are formed to be a non-display region via hole; and the first metal layer and the second metal layer are electrically connected with a conductive film provided within the first via hole, the connecting hole and the second via hole.

2. The array substrate claimed as claim 1, further comprising a gate electrode, a common electrode and source and drain electrodes, and the first metal layer and the second metal layer are each connected to one of the gate electrode, the common electrode and the source and drain electrodes.

3. The array substrate claimed as claim 1, wherein, a pixel electrode is included in the display region of the array substrate, the conductive film has a same material as the pixel electrode in the display region, and the conductive film is connected to the pixel electrode.

4. The array substrate claimed as claim 1, wherein, a first active layer is disposed between the first insulating layer and the first passivation layer, and a second active layer is disposed between the second insulating layer and the second metal layer.

5. The array substrate claimed as claim 1, wherein, partial surface of the first metal layer is exposed by the first via hole, and partial surface of the second metal layer is exposed by the second via hole.

6. The array substrate claimed as claim 1, wherein, cross sections of the first via hole and the second via hole taken along a direction parallel to a surface of the base substrate are unenclosed patterns, and openings of the unenclosed patterns are joined to the connecting hole.

7. The array substrate claimed as claim 1, wherein, the first insulating layer and the second insulating layer are made of a same material.

8. The array substrate claimed as claim 1, wherein, a thin film transistor is included in the display region of the array substrate, and the first insulating layer and the second insulating layer are each joined to a gate insulating layer of the thin film transistor.

9. A display device, comprising the array substrate claimed as claim 1.

10. A manufacturing method of the array substrate claimed as claim 1, comprising:
step S1: forming the first laminated structure and the second laminated structure on the base substrate; wherein, the first laminated structure includes the first metal layer, the first insulating layer and the first passivation layer sequentially disposed in a laminated manner on the base substrate; the second laminated structure includes the second insulating layer, the second metal layer and the second passivation layer sequentially disposed in a laminated manner on the base substrate; the first insulating layer and the second insulating layer are joined, and the first passivation layer and the second passivation layer are joined to form a passivation layer;
step S2: forming a gap between the first laminated structure and the second laminated structure, so that the gap between the first laminated structure and the second laminated structure constitutes the connecting hole, the first insulating layer and the second insulating layer that are joined are separate, and the first passivation layer and the second passivation layer that are joined are separate; providing a first via hole that runs through the first passivation layer and the first insulating layer in the first passivation layer, providing a second via hole that runs through the second passivation layer in the second passivation layer; wherein,
the wall of the first via hole is provided with a first breach in a height direction of the first via hole, the length of the first breach is the same as the height of the first via hole; the wall of the second via hole is provided with the second breach in the height direction of the second via hole, the length of the second breach is the same as the height of the second via hole; the first via hole is communicated with the connecting hole via the first breach, the second via hole is communicated with the connecting hole via the second breach, and the first via hole, the second via hole and the connecting hole are formed to be the non-display region via hole; and Step S3: forming the conductive film within the first via hole, the connecting hole and the second via hole, so that the first metal layer and the second metal layer are connected with the conductive film.

11. The manufacturing method of the array substrate claimed as claim 10, wherein, the step S1 includes:

forming the first metal layer situated at the non-display region on the base substrate;

forming the first insulating layer situated at the non-display region on the first metal layer, forming a second insulating layer situated at the non-display region on the base substrate; the first insulating layer and the second insulating layer are joined together;

forming the second metal layer situated at the non-display region on the second insulating layer, and making an exposing hole be formed by the second metal layer, the first metal layer and the second insulating layer; and forming the passivation layer situated at the non-display region on the second metal layer, on the first insulating layer and within the exposing hole.

12. The manufacturing method of the array substrate claimed as claim 11, wherein, the step S2 includes:

providing the first via hole within a region of the passivation layer corresponding to the first insulating layer, the first via hole running through the first insulating layer, and a region of the passivation layer corresponding to the first insulating layer; providing the second via hole within a region of the passivation layer corresponding to the second metal layer, the second via hole running though the region of the passivation layer corresponding to the second metal layer; providing a connecting hole within a region of the passivation layer corresponding to the exposing hole, the connecting hole running through the second insulating layer, and a region of the passivation layer corresponding to the exposing hole; the connecting hole being communicated with the first via hole and the second via hole, respectively, so that the first insulating layer and the second insulating layer that are joined together are separate, and the first passivation layer is obtained on the first insulating layer, and the second passivation layer is obtained on the second metal layer.

13. The manufacturing method of the array substrate claimed as claim 10, wherein, a material of the conductive film is the same as a material of a pixel electrode, the conductive film and the pixel electrode are formed by one patterning process; the first metal layer and the second metal layer are each connected to a source/drain electrode, forming the conductive film in the first via hole, the connecting hole and the second via hole includes: forming a pixel material layer on the first passivation layer and the second passivation layer and in the first via hole, the second via hole and the connecting hole, and then forming the conductive film in the first via hole, the second via hole and the connecting hole by one patterning process.

14. The manufacturing method of the array substrate claimed as claim 11, wherein, the first via hole, the second via hole and the connecting hole are formed by one patterning process; wherein, the first metal layer has a same material as a gate electrode, and the first metal layer and the gate electrode are formed by one patterning process; the second metal layer has a same material as source and drain electrodes, and the source and drain electrodes, the second metal layer and the exposing hole are formed by one patterning process.

15. The manufacturing method of the array substrate claimed as claim 12, further comprising forming a first active layer on the first insulating layer, forming a second active layer joined to the first active layer on the second insulating layer, the second metal layer being formed on the second active layer, the region of the passivation layer corresponding to the first insulating layer being formed on the first active layer, the exposing hole being formed by the first active layer, the second active layer and the second metal layer; the connecting hole being communicated with the first via hole and the second via hole, respectively, and the first active layer and the second active layer that are joined being separate.

16. The manufacturing method of the array substrate claimed as claim 10, wherein, cross sections of the first via hole and the second via hole taken along a direction parallel to a surface of the base substrate are unenclosed patterns, and openings of the unenclosed patterns are joined to the connecting hole.

17. The manufacturing method of the array substrate claimed as claim 10, wherein, the first insulating layer and the second insulating layer are made of a same material, and the first insulating layer and the second insulating layer are formed simultaneously with a gate insulating layer of a thin film transistor for forming the array substrate.

18. A manufacturing method of an array substrate, comprising:

forming a first metal layer pattern on a base substrate, forming an insulating layer on the base substrate and the first metal layer pattern, forming a second metal layer pattern on the insulating layer, the first metal layer pattern and the second metal layer pattern being staggered with respect to each other in a direction parallel to a surface of the base substrate so as to form an interval between them, forming a passivation layer on the insulating layer and the second metal layer pattern, forming a connecting hole at a location of the passivation layer and the insulating layer corresponding to the interval between the first metal layer pattern and the second metal layer pattern, so that the insulating layer is formed to be a first insulating layer over the first metal layer pattern and a second insulating layer over the second metal layer pattern, and the passivation layer is formed to be a first passivation layer over the first metal layer pattern and a second passivation layer below the second metal layer pattern, forming a first via hole in the first passivation layer and the first insulating layer, so as to expose partial surface of the first metal layer pattern; forming a second via hole in the second passivation layer, so as to expose partial surface of the second metal layer pattern, the first via hole and the second via hole being each communicated with the connecting hole, and forming a conductive film within the first via hole, the connecting hole and the second via hole, so that the first metal layer and the second metal layer are connected with the conductive film.

* * * * *